United States Patent
Wapner et al.

[11] Patent Number: 6,059,001
[45] Date of Patent: *May 9, 2000

[54] APPARATUS FOR MANUFACTURING MICROTUBES WITH AXIALLY VARIABLE GEOMETRIES

[75] Inventors: Phillip G. Wapner; Wesley P. Hoffman, both of Palmdale; Gregory J. Price, San Diego, all of Calif.

[73] Assignee: The United States of America as represented by the Secretary of the Air Force, Washington, D.C.

[ * ] Notice: This patent is subject to a terminal disclaimer.

[21] Appl. No.: 08/472,574

[22] Filed: Jun. 7, 1995

Related U.S. Application Data

[63] Continuation-in-part of application No. 08/229,962, Apr. 15, 1994.

[51] Int. Cl.[7] .................................................. B65H 81/00
[52] U.S. Cl. ........................ 156/425; 156/155; 156/247; 156/428; 156/429; 156/430
[58] Field of Search ..................... 156/425, 428, 156/429, 430, 173, 175, 169, 172, 148, 247, 155

[56] References Cited

U.S. PATENT DOCUMENTS

| | | |
|---|---|---|
| 4,051,284 | 9/1977 | Ohkubo et al. ............... 156/247 X |
| 5,187,399 | 2/1993 | Carr et al. . |
| 5,189,323 | 2/1993 | Carr et al. . |
| 5,252,881 | 10/1993 | Muller et al. . |
| 5,262,695 | 11/1993 | Kuwano et al. . |
| 5,366,587 | 11/1994 | Ueda et al. . |
| 5,378,583 | 1/1995 | Guckel et al. . |
| 5,426,942 | 6/1995 | Suzuki . |
| 5,789,045 | 8/1998 | Wapner et al. .................. 428/34.4 |
| 5,888,436 | 3/1999 | Keith ............................. 264/103 |

Primary Examiner—Jeff H. Aftergut
Attorney, Agent, or Firm—Stanton E. Collier

[57] ABSTRACT

The present invention is a technique for manufacturing microtube devices which have circumferential geometries repeated either uniformly or nonuniformly along the tube or device axis with sub-micron precision. The preferred manufacturing process involves forming a complex mandrel and giving it a metallic and/or nonmetallic coating or coatings by any of a variety of techniques. The mandrel can then be removed by appropriate chemical or physical means, leaving a microtube structure having an axial profile consisting of repeat units duplicating those on the mandrel. One technique for forming the complex mandrel consists of drawing a single core fiber (or bundle of core fibers) through a confining orifice. The fiber is held with minimal constraint (typically by friction), so that no breakage takes place as it is drawn through the orifice. However, enough constraint exists so that torque applied tangentially by another overwrapping fiber (or fibers) as it is being wound around the core fiber does not cause the core fiber to slip in the direction of applied torque. Moreover, the overwrapping fiber must be wound sufficiently close to the constraining orifice that twisting of the core fiber in the direction of torque is minimized to such an extent that unwinding, or "backlash" does not occur when constraining forces are removed at the end of winding.

9 Claims, 4 Drawing Sheets b >> c    a >> c

6,059,001

APPARATUS FOR MANUFACTURING MICROTUBES WITH AXIALLY VARIABLE GEOMETRIES

CROSS REFERENCE TO RELATED APPLICATION

This application is a continuation-in-part of application Ser. No. 08/229,962 filed on Apr. 15, 1994, the disclosure of which is incorporated herein by reference.

STATEMENT OF GOVERNMENT INTEREST

The invention described herein may be manufactured and used by or for the Government for governmental purposes without the payment of any royalty thereon.

BACKGROUND OF THE INVENTION

The present invention relates to machines, and, in particular, relates to micromachines, and further, relates to free-standing microtube devices.

In the past, micromachines have been manufactured with planar technology associated with integrated circuity. For example, a gas sensor may be constructed on a semiconductor chip and integrated with the controlling electronics thereon. A vibrating member being sensitive to a gas is constructed by applying a pattern to a substrate and removing the exposed material leaving the vibrating member over a void which was caused by the removal. The restriction of micromachines to planar substrates prevents greater application of these micromachines to other areas of technology.

Thus, there exists a need for microtube devices not associated with planar technology.

SUMMARY OF THE INVENTION

In the present invention, a technique is described for manufacturing microtube devices which have circumferential geometries repeated either uniformly or nonuniformly along the tube or device axis with sub-micron precision. The preferred manufacturing process involves forming a complex mandrel and giving it a metallic and/or nonmetallic coating or coatings by any of a variety of techniques. The mandrel can then be removed by appropriate chemical or physical means, leaving a microtube structure having an axial profile consisting of repeat units duplicating those on the mandrel.

One technique for forming the complex mandrel consists of drawing a single core fiber (or bundle of core fibers) through a confining orifice. The fiber is held with minimal constraint (typically by friction), so that no breakage takes place as it is drawn through the orifice. However, enough constraint exists so that torque applied tangentially by another overwrapping fiber (or fibers) as it is being wound around the core fiber does not cause the core fiber to slip in the direction of applied torque. Moreover, the overwrapping fiber must be wound sufficiently close to the constraining orifice that twisting of the core fiber in the direction of torque is minimized to such an extent that unwinding, or "backlash" does not occur when constraining forces are removed at the end of winding. Also, sufficient force must be exerted by the overwrapping fiber to insure that it winds itself tightly around the core fiber, thereby precisely maintaining desired dimensions and geometry. Finally, physical properties of the overwrapping fiber must be such that torsional stresses remaining after winding are insufficient to disrupt configuration of the formed mandrel when constraining forces of the winder are released. Polyetherimide has been found to be an excellent overwrapping fiber in this respect.

Therefore, one object of the present invention is to provide a method of making free-standing microtube devices.

Another object of the present invention is to provide a variety of microtube devices.

These and many other objects and advantages of the present invention will be readily apparent to one skilled in the pertinent art from the following detailed description of a preferred embodiment of the invention and the related drawings.

DETAILED DESCRIPTION OF THE PREFERRED EMBODIMENT

The present invention provides techniques for manufacturing microtube devices which have circumferential geometries repeated either uniformly or nonuniformly along the tube or device axis with sub-micron precision. The preferred manufacturing process involves forming a complex mandrel and giving it a metallic and/or nonmetallic coating or coatings by any of a variety of techniques. The mandrel can then be removed by appropriate chemical or physical means, leaving a microtube structure having an axial profile consisting of repeat units duplicating those on the mandrel.

One technique, for example, for forming the complex mandrel consists of drawing a single core fiber (or bundle of core fibers) through a confining orifice. The fiber is held with minimal constraint (typically by friction), so that no breakage takes place as it is drawn through the orifice. However, enough constraint exists so that torque applied tangentially by another overwrapping fiber (or fibers) as it is being wound around the core fiber does not cause the core fiber to slip in the direction of applied torque. Moreover, the overwrapping fiber must be wound sufficiently close to the constraining orifice that twisting of the core fiber in the direction of torque is minimized to such an extent that unwinding, or "backlash" does not occur when constraining forces are removed at the end of winding. Also, sufficient force must be exerted by the overwrapping fiber to insure that it winds itself tightly around the core fiber, thereby precisely maintaining desired dimensions and geometry. Finally, physical properties of the overwrapping fiber must be such that torsional stresses remaining after winding are insufficient to disrupt configuration of the formed mandrel when constraining forces of the winder are released. Polyetherimide has been found to be an excellent overwrapping fiber.

In all areas of science and engineering, as miniaturization occurred, new physical and chemical effects and parameters have either become dramatically elevated in importance or actually become the dominant variables. In a very real manner of speaking, new worlds are entered into, in which design considerations and forces that are normally negligible in human-scale applications become essential to successful utilization and application of the miniaturized technology. What makes the winder used in this invention uniquely different from other larger winding apparatus is that it specifically addresses these micro-effects. In a larger macro-sized winder, overwrap torques due to fiber winding position and fiber physical properties are negligible and they are either ignored altogether or simply tolerated. In this winder, however, because of the micro-scale, they are critical to successful fabrication of microdevices of the present invention.

Figure 1:
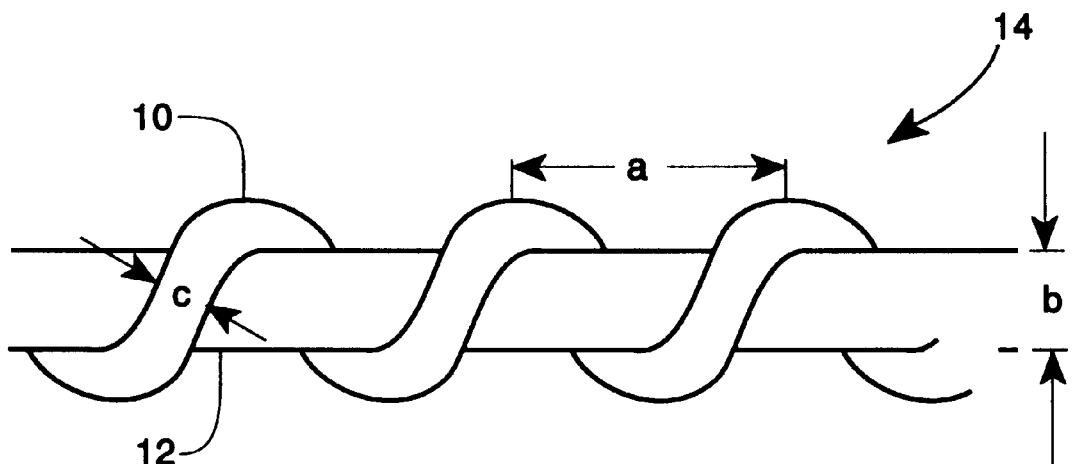
FIG. 1 illustrates a fiber wrapped around a core fiber.

Referring to FIG. 1, actual winding of the overwrapping fiber(s) 10 around the core fiber(s) 12 can be accomplished in numerous ways. The three most useful are: (1) rotating the core fiber 12 as it is drawn through the orifice, while not allowing the overwrapping fiber to rotate, but only to translate along its axis towards the core fiber under controlled tension; (2) holding the core fiber non-rotating as it is drawn through the orifice, and the overwrapping fiber would around it under tension; and (3) rotating both core and overwrapping fiber either in the same or opposing directions during winding with the result being a braided or woven overwrap.

Spacing of the wound overwrapping fiber(s) on the core fiber(s) is accomplished by controlling the number of complete overwrap windings allowed to occur per unit displacement of the core fiber away from this orifice. If core displacement and overwrap rotation rates are held at a present value, a helical winding, FIG. 1, will result which will have axial spacing dependent on the actual rates involved. If either core displacement or overwrap rotation rates are allowed to vary, much more complex axial repeat units, or geometries on the tube mandrel, can be generated. Under suitable conditions, no repeat units will exist. However, the resulting winding profile will be reproducable as long as the same rotation-rate patterns are employed. It is also possible to allow the core fiber to reverse direction; i.e., draw it back into the constraining orifice. This will result in over-winding of the overlap fibers on themselves.

The core fibers and overwrap fibers do not have to be of the same material, same cross-sectional shape and dimension, or even of circular cross-section. The overwrap fibers can also be coated with a suitable material either prior to winding or after winding to increase their bonding to core fibers, to fill in gaps and/or crevasses between fibers, or for special microtube manufacture. This can also be done with a finished-wound mandrel. It is also possible to melt the surface of the overwrap fibers prior to winding over core fibers so that their position is secured by a melt-bond.

Another technology capable of forming complex mandrel geometries is to melt extrude overwrap material directly onto core fibers either in a circumferential or axial manner. For purely circumferential melt placement, translation of the core fiber is halted but its rotation is continued. In contrast, for purely axial melt placement on the core-fiber, rotation is halted, but translation allowed to continue. It should be noted that there are numerous combinations of these two elementary processes which can be used to produce complex and random mandrel geometries. In all of these processes an appendage will be laid down on the core fiber. It should be noted that complex mandrels formed in this manner can be used as "core fibers" in subsequent processing. In this manner, non-circular core-fiber cross-sections can be fashioned from circular core fibers. These melt-processed non-circular core-fiber segments can be interspersed at will between either repeat wound segments or other repeat melt-processed non circular core-fiber segments with different geometry. It is also possible to make a microtube mandrel with this technique that has no repeat units, only a geometry that varies both circumferentially and/or cross-sectionally in a predetermined fashion. It should be noted here that melt extrusion of overlap material onto core fibers is really an extension to the liquid phase of the initial micro-winder concept. Rather than place solids (in the form of fibers) as overlap material around core fibers, melt extrusion employs the liquid phase. Other liquid-phase processes which can be utilized in this fashion are coating with stripes or bands of polymer solutions followed by drying (solvent removal), and particle beam or radiation curing of stripes or bands of a monomer coating followed by removal of uncured monomer. Finally, it must be noted that vapor-phase processing is also a viable technique for forming complex mandrel geometries. Techniques such as low-pressure plasma spraying either through appropriate "masks" or using fine nozzles (10 microns or less in diameter) can be employed to form overlap material on core fibers. Other types of chemical or physical vapor deposition, such as, magnetron sputtering can also be employed using a masking technique.

A third technology useful for forming complex mandrel geometries is conceptually the opposite of previous mandrel-forming techniques in that it removes material from a core fiber, either in a circumferential or axial manner, rather than depositing material in order to form a particular geometry. A rotating translating core fiber can be "trimmed" of excess material by energy (ie. electron, ion, laser) beam ablation or other non-contact high-energy-delivery process. By appropriately controlling core-fiber rotation and translation, as well as location of the ablating beam relative to core-fiber axis, any of the complex mandrel geometries obtained with overlap-material deposition processes discussed previously can be duplicated.

Figure 2:
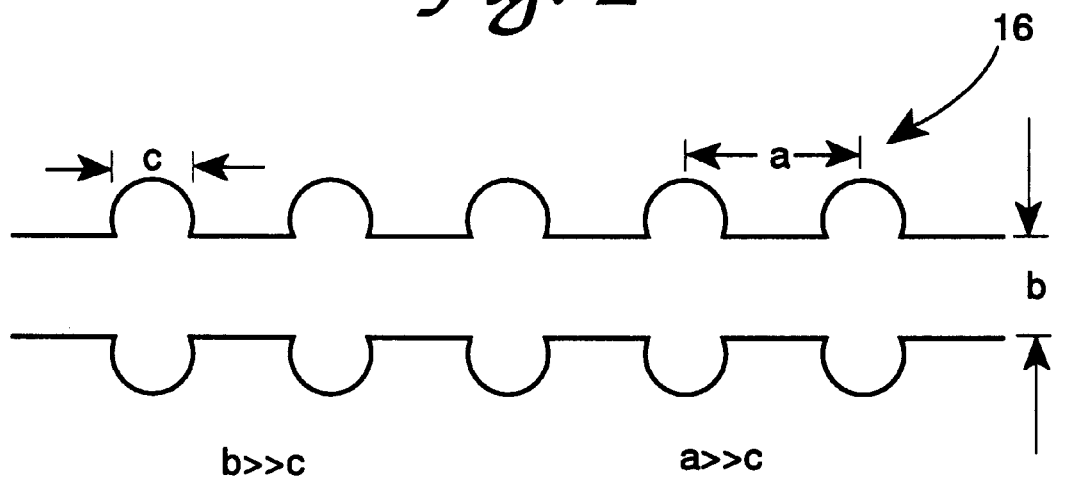
FIG. 2 illustrates a microbellow formed on the structure of FIG. 1.

The simplest winding pattern is that of a helix 14, FIG. 1; i.e., a circular overwrap fiber 10 of diameter "c" wound around another circular core fiber 12 of diameter "b", with a spacing of "a". The winding can be either right-handed or left-handed helix 14, and spacing can vary from a minimum of "a" equal to "c" to "a" approaching infinity. If the core fiber diameter and overwrap fiber spacing are considerably larger than overwrap fiber diameter, the microtube resulting after coating and fiber removal will resemble a microbellow 16, FIG. 2. There are numerous variations to this simple procedure. Three such variations involve changing the fiber cross-sectional-shape, coating sequences, and method of overwrapping are given below.

Figure 3:
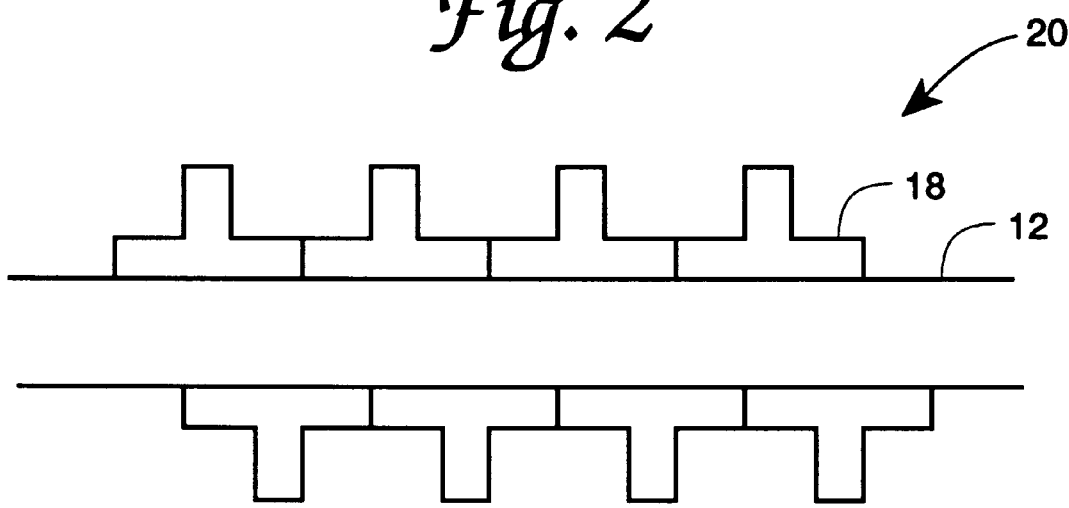
FIG. 3 illustrates a microtube threaded screw.

A variation of the helical winding pattern mentioned above is to employ noncircular overwrap fibers and/or noncircular core fibers. For example in FIG. 3, if a trilobal overwrap fiber 18 is wound tightly enough around a circular core fiber 12, the trilobal fiber will deform into the shape of a "T". By spacing the "T" overwraps such that there are no gaps in between, a threaded screw 20 is precisely formed. It can be either right-hand or left-hand thread. Depending on the application, core and overwrap fibers may or may not be removed after coating. In the case of a screw they would probably be retained whereas in the case of a bellows they would be removed.

Figure 4:
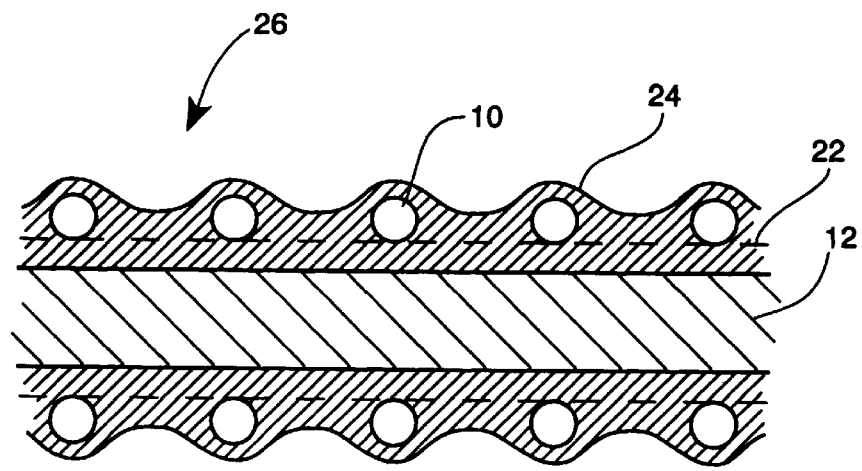
FIG. 4 illustrates a microtube having a single layer microtube wrapped about such.
Figure 5:
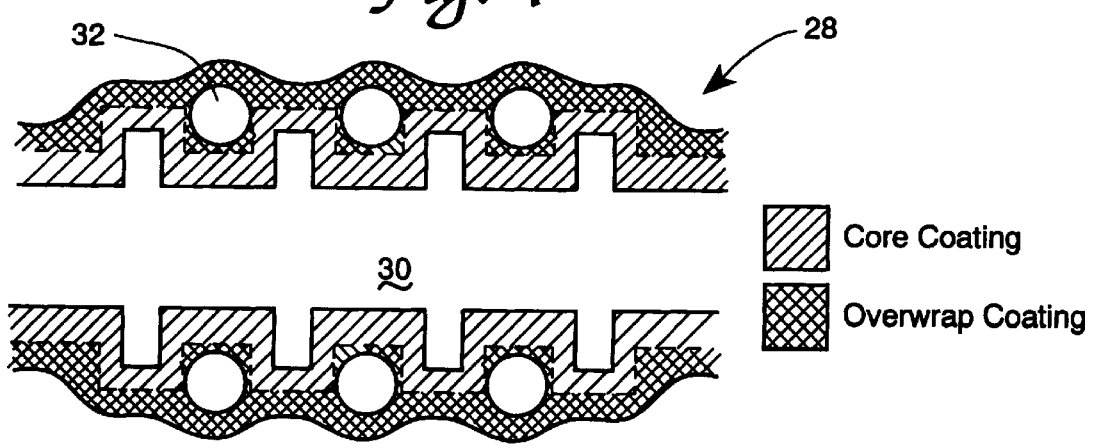
FIG. 5 illustrates a microtube threaded screw having a single channel wrapped thereabout and coated.

A second modification to the basic helical-wrap pattern, FIG. 4, is to coat the core fiber 12 with a layer 22 before wrapping it with one or more overwrap fibers 10, and then coating it again with a second layer 24. Once the core fiber 12 and all overwrap fibers 10 have been removed, a microtube 26 is formed that consists of a hollow helical channel wound around a hollow core tube. This process can be repeated to give as many layers of helical overwrap channels as desired. The two separate coating procedures and materials used do not have to be the same, and more than one coating can be employed in each. Also, noncircular core and/or overwrap fibers can be employed providing correspondingly shaped-core tubes and/or helical overwrap channels. An example of this is to employ a threaded-screw microtube 20 as the core fiber, and then overwrap circular fibers in the screw threads. FIG. 5 illustrates such a microtube device 28 once both core and overwrap coatings have been applied, and both core and overwrap fibers have been removed. The resulting microtube devices 28 could be used, for example, as heat exchangers. A fluid would flow in channel 30 and a second fluid could flow in the helical channel 32.

Another variation of the helical-wrap pattern is to employ core and overwrap fibers of unrelated materials that utilize removal methods that are independent of one another. For example, once a helically-overwrapped mandrel has been fabricated, the core fiber can be preferentially removed either physically or by reaction or solvation, leaving the helical overwrap fiber intact which can then be coated. Depending upon the application, the helical overwrap fiber may be retained in the coating, resulting in a composite spring, or the coating may be removed, resulting in a microtube spring.

Figures 9A, 9B:
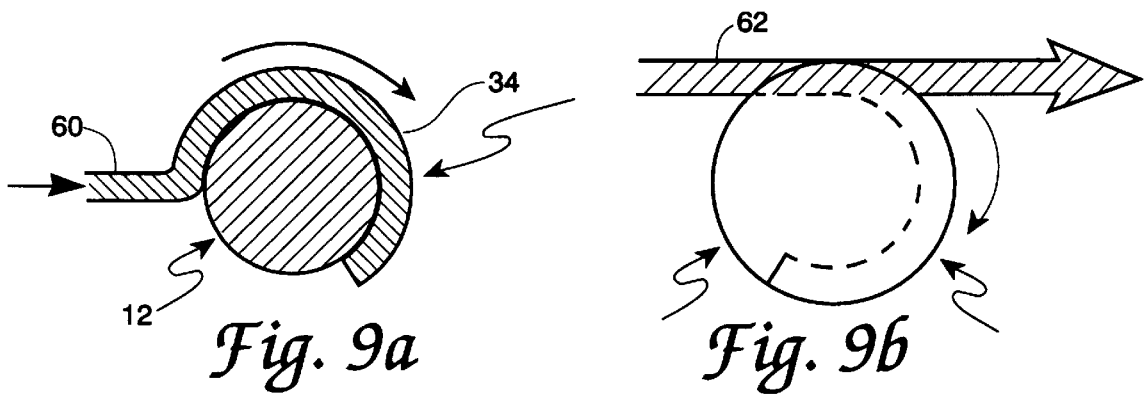
FIGS. 9A and 9B illustrate different methods of making structures with axial repeat units.

If melt-processing, vapor-processing, or ablation-processing is employed, an actual bellows can be fabricated; i.e., zero pitch is achieved by forming a completely circumferential bead 34, FIG. 9A, on the core fiber 12 at each repeat-unit location. As with fiber winding, more than one bead can be placed immediately next to another, or on top of another during a subsequent step of mandrel fabrication, to achieve whatever geometry is desired. This is important because it avoids thermally stressing or actually melting core fibers and/or other solidified overlay material by attempting too much processing in one step. The zero pitch microbellows would look similar to the microbellow 16 of FIG. 2.

As mentioned above, there are numerous ways of actually winding overwrapping fibers over core fibers. The following winding apparatus 36, depicted in FIGS. 6, 7, and 8, has been constructed and used to make microtube mandrels which, after coating and fiber removal, produced microbellows, microsprings, and microscrews, among other products. The winding apparatus 36 consists of two rotating gripping vises 38, whose motion is coordinated by a sliding actuator 40. This actuator 40 consists of one noncircular tube 42 shaped to smoothly fit inside another similarly-shaped tube 44, both mounted in drive wheels 46 and 48, causing rotation of each vise. This synchronizes rotary motion of both vises, yet permits linear translation of the second, or "locking" vise 50, that holds and pulls accompanying core fibers. The other vise, or "pull-through" vise 52 does not translate linearly. Spring-loaded jaws 53, FIG. 7, centrally located in each vise have adjustable screw mechanisms. These jaws allow the locking vise to hold core fibers tightly, completely preventing any slippage. Simultaneously, jaws in the pull-through vise are able to grasp core fibers with just enough force to ensure rotary motion precisely in step with the vises, yet gentle enough to allow smooth fiber pull-through without elongation. FIGS. 7 and 8 illustrate the overwrap positioning device 54 which is positioned closely to the pull-through vise 52. It consists of a slotted guide 56 which feeds overwrap fibers 10 over a pulley 55 to the rotating core fibers 12 using the weight of the fiber and an additional weight 58 attached to the overwrap fiber 10 as a tensioning mechanism. The positioning device spacing 57 must be close enough to the pull-through vise to eliminate twisting of core fibers in the direction of applied overwrap torque. This also requires careful balancing of overwrap tensioning weight. Too little weight, and overwrap fibers will not wind tightly leaving gaps. Too much weight, and core fibers will twist no matter what positioner spacing is used. When constraining forces supplied by the vise jaws are removed at the end of overwrapping, any unwinding resulting from core fiber twisting will destroy the fabricated micro-mandrel.

Figure 6:
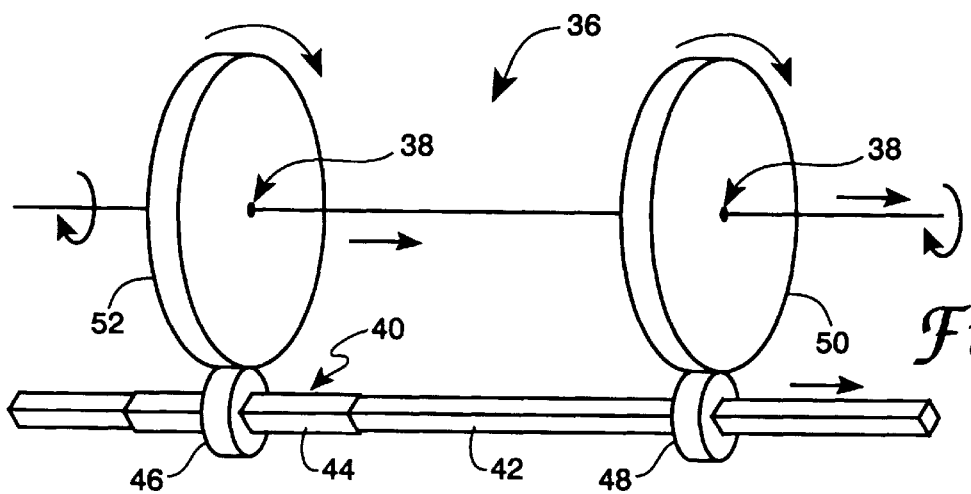
FIG. 6 partially illustrates a device for winding a fiber about a core fiber.
Figure 7:
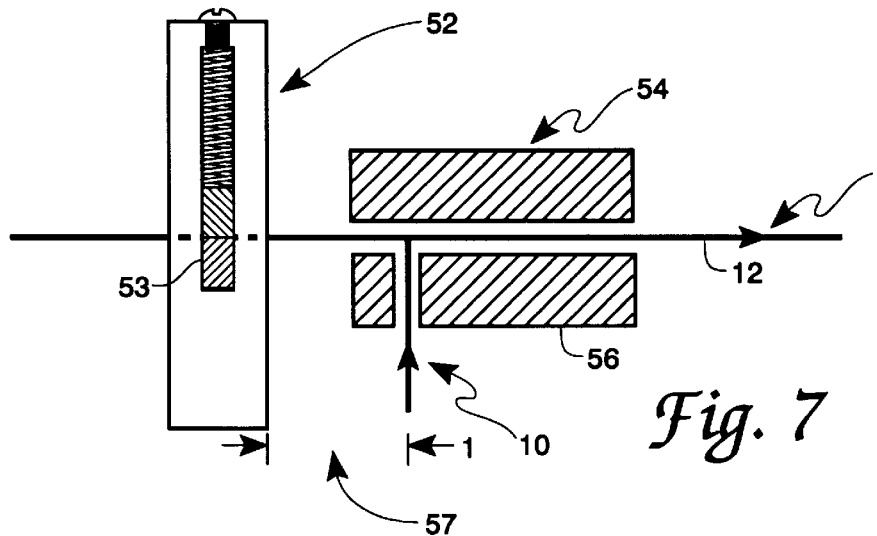
FIG. 7 partially illustrates a device for winding a fiber about a core fiber using a positioner.
Figure 8:
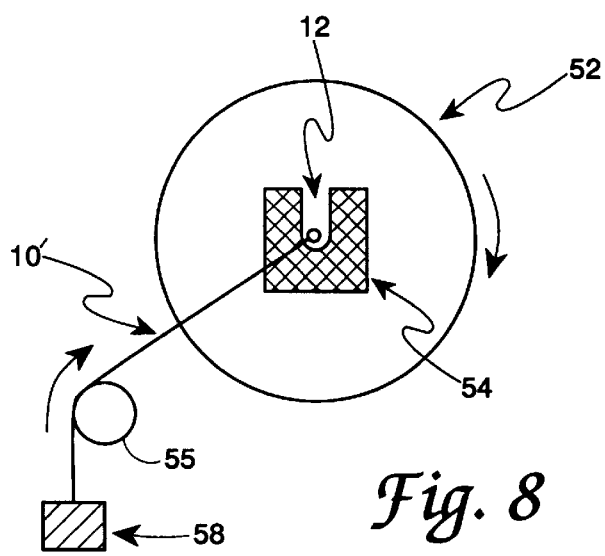
FIG. 8 is an axial view of the device of FIG. 7.

FIG. 9 illustrates how the basic winding apparatus depicted in FIGS. 6, 7, and 8 can be modified to enable melt or solution-processing, vapor-processing, and ablation-processing to be performed. Essentially all that needs to be done is to replace the positioner 54 and accompanying overwrap fiber and overwrap weight with new devices capable of carrying out each particular mode of processing. For melt or solution-processing, a miniature polymer extruder similar in concept to a hot hypodermic syringe delivers molten or solvated overwrap material 60 to the rotating translating core fiber 12. For Vapor-processing, a miniature low-pressure plasma spray torch delivers overwrap material. And for ablation-processing, a suitable high-energy delivery system such as a radiative or particle beam 62 can be positioned in such a fashion that it "trims" unwanted material from the rotating translating core fiber 12. Although these processes are quite different from overwrap fiber winding, they too must be designed so that tensions and stresses, thermal as well as mechanical, induced by each type of process are carefully controlled. Otherwise unacceptable distortion of the mandrel will take place either upon release from the basic winding apparatus or upon subsequent processing. As mentioned previously, this micro-winder and its accompanying technology differs fundamentally from similar, but macroscopic, applications. Forces and effects usually considered negligible in macroscopic terms become overriding at the micron level. For example, overwrap stress-strain properties are inconsequential in macroscopic winding applications. Typically, melting point, abrasion resistance, or electrical resistance are paramount. At the micron level, however, stress-strain behavior cannot be so easily dismissed. It is integral to successful fabrication.

The most straightforward devices capable of being manufactured with this process are bellows, springs, and screws having dimensions on the micron level. Utilization of such miniature mechanical apparatus requires considerable innovation on the part of design engineers. Downsized applications range from flexible electrical connectors for microcircuitry to novel new sensors utilizing microspring or microbellows displacements as a means of measuring applied force. Most Chemical or Mechanical Engineers will readily identify FIGS. 4 and 5 as heat exchangers, capable of being utilized in either co-current flow or counter-current flow situations. An immediate application certainly exists in the cooling of high-power-density electronic microcircuits.

These or similar configurations of microtubes can also be employed as microreactors for chemical synthesis.

Figure 10:
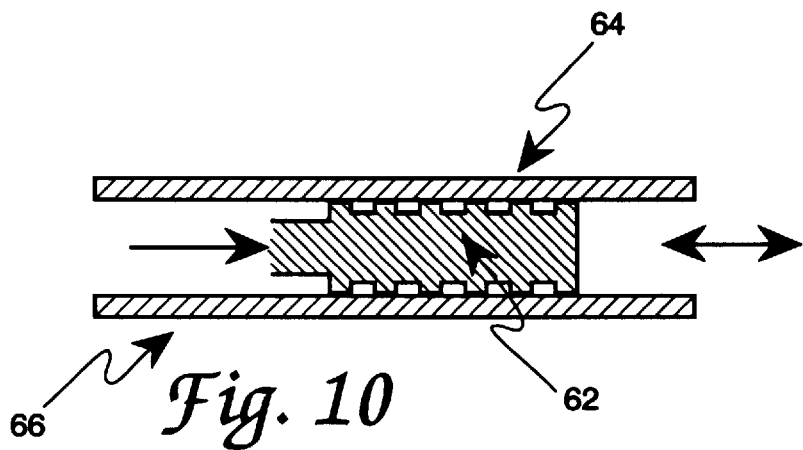
FIG. 10 illustrates a linear microactuator.
Figure 11:
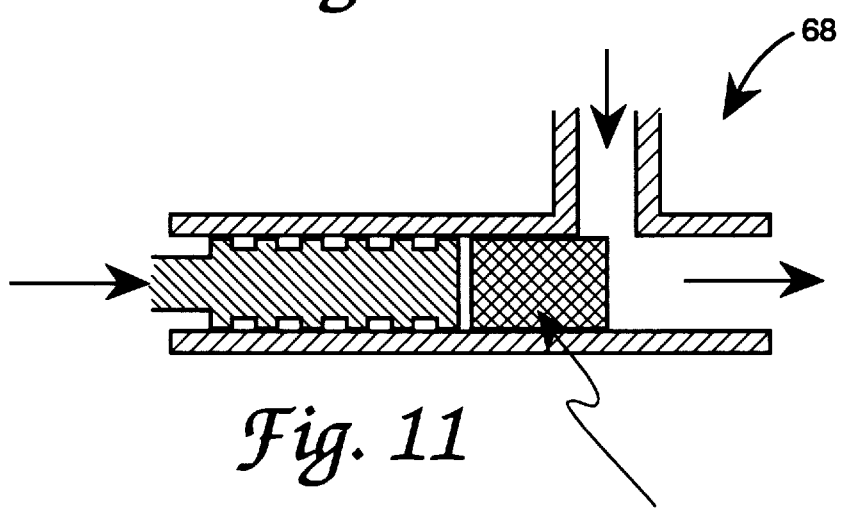
FIG. 11 illustrates a microvalve.

Bellows can be used as flexible couplings between devices. A somewhat more sophisticated application at the micron level utilizes two of the properties of bellows; i.e., they are flexible and elongate under pressure if one end is sealed. In FIG. 10, the bellows 62 are inserted into a rigid tube 64, bending is prevented and only one dimensional motion is permitted. The resulting micro-actuator 66 is illustrated in FIG. 10. Obviously, the actuator can have as many degrees of freedom as there are bellows and the motion of these bellows can be nonlinear as a function of driving force. Many other uses for such a device can be envisioned. For example, the bellows sealed on one end and inserted in a rigid tube can also be used as a body for a piston used in a valve or pump. A micro-valve 68 in the half-open position is illustrated in FIG. 11.

Figures 12A, 12B:
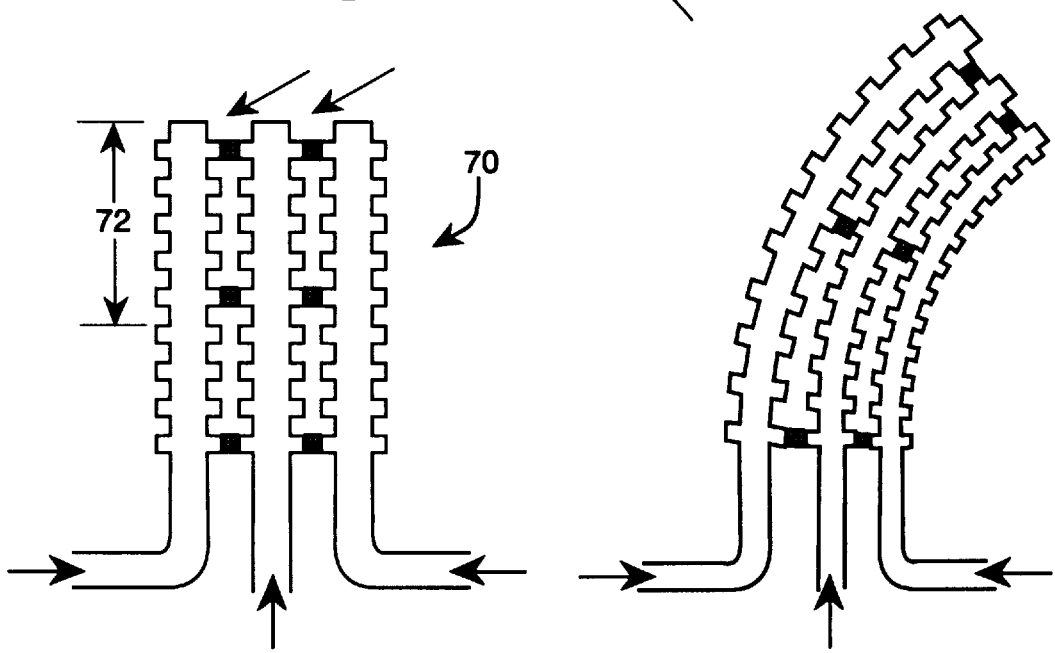
FIGS. 12A and 12B illustrate microfingers that are able to be pointed.

In FIGS. 12A and 12B, if two or more bellows are attached together carefully at appropriate intervals 72 into a microbellows-assembly 70, pressurizing one of them more than the others will cause the remaining bellows in the assembly to deform in a direction away from the pressurized bellows. A similar response can be achieved by causing one bellows to shrink. The overall effect can be thought of as similar to bending one's forefinger. Putting together two or more of these "micro-fingers" will result in a "micro-hand" which provides for manipulation at the micron level. Moreover, pressurizing or otherwise activating more than one bellows in an assembly will cause the entire assemble to change length as well as bend. By appropriately mounting microbellows-assemblies together, three-dimensional manipulation at the micron-level becomes feasible. Applications for these manipulators include positioning and working with specimens under microscopes, fabricating and/or repairing microelectromechanical systems (MEMS), and microsurgery.

In any applications of the microbellows, sealed on one or both ends, the elongation or contraction can take place in a number of ways. These include hydrolytic or pneumatic actuation as well as more exotic techniques, such as, fabrication of the bellows from piezoelectric material, magnetostrictive material, or shape-memory alloy. Obviously, the bellows need not be closed on either end to utilize the exotic techniques.

Clearly, many modifications and variations of the present invention are possible in light of the above teachings and it is therefore understood, that within the inventive scope of the inventive concept, the invention may be practiced otherwise than specifically claimed.

What is claimed is:

1. A winding apparatus for producing mandrels for microtube devices, said winding apparatus comprising:

a pull-through vise, said pull-through vise rotating about a common axis, said pull-through vise having jaws for adjustably holding a core fiber, said core fiber being able to be pulled through said jaws of said pull-through vise;

a locking vise, said locking vise rotating about said common axis, said locking vise having jaws for fixedly holding said core fiber;

drive means, said drive means rotating said vises together, said drive means able to drive said locking vise during translation on said common axis; and means for changing an external configuration of a surface of said core fiber.

2. A winding apparatus as defined in claim 1 wherein said means for changing said core fiber external configuration uses a solid fiber process, a liquid phase-process, a vapor phase-process or an ablation process.

3. A winding apparatus as defined in claim 2 wherein said means for changing said core fiber external configuration uses said solid fiber process which further comprises:

an overwrap fiber positioner located near said pull-through vise.

4. A winding apparatus as defined in claim 3 wherein said overwrap fiber positioner has said core fiber passing therethrough, said overwrap fiber positioner having a slotted guide for holding an overwrap fiber therein while said overwrap fiber is contacting said core fiber, and including means for tensioning said overwrap fiber during application to said core fiber.

5. A winding apparatus as defined in claim 4 further including means for moving said overwrap fiber positioner about said core fiber during application.

6. A winding apparatus as defined in claim 2 further including means for applying a liquid or vapor phase material about said core fiber.

7. A winding apparatus as defined in claim 6 further including means for moving said means for applying about said core fiber during application.

8. A winding apparatus as defined in claim 2 further including means for removing a portion of said core fiber by ablation.

9. A winding apparatus as defined in claim 8 further including means for moving said means for removing about said core fiber.

* * * * *